(12) United States Patent
Castor-Perry et al.

(10) Patent No.: US 6,812,793 B2
(45) Date of Patent: Nov. 2, 2004

(54) POWER SUPPLY REJECTION CIRCUIT FOR AN AUDIO AMPLIFIER

(75) Inventors: Kendall V. Castor-Perry, London (GB); Fred J. Shipley, Lucas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/313,347

(22) Filed: Dec. 6, 2002

(65) Prior Publication Data

US 2003/0141934 A1 Jul. 31, 2003

Related U.S. Application Data

(60) Provisional application No. 60/349,887, filed on Jan. 17, 2002.

(51) Int. Cl.[7] .............................. H03F 3/04; H03F 3/217; H03F 1/26
(52) U.S. Cl. .................. 330/297; 330/251; 330/149
(58) Field of Search ................................. 330/297, 251, 330/149

(56) References Cited

U.S. PATENT DOCUMENTS

| 4,217,555 | A | * | 8/1980 | Iwamatsu | 330/267 |
| 4,258,406 | A | * | 3/1981 | Seki | 361/79 |
| 4,339,730 | A | * | 7/1982 | Yokoyama | 330/297 |
| 6,611,169 | B2 | * | 8/2003 | Mendenhall | 330/51 |

* cited by examiner

Primary Examiner—Patricia Nguyen
(74) Attorney, Agent, or Firm—Bret J. Petersen; W. James Brady, III; Frederick J. Telecky, Jr.

(57) ABSTRACT

A circuit for power amplification for an audio amplifier that reduces power supply noise amplified to the load. The circuit takes the prior art circuit's existing output coupling cap and power supply decoupling cap and connecting them in series from the power supply to ground. The output of the amplifier is then directly coupled to the load and the other side of the load is connected at the "null point" between the two capacitors.

12 Claims, 1 Drawing Sheet

POWER SUPPLY REJECTION CIRCUIT FOR AN AUDIO AMPLIFIER

This application claims priority of U.S. Provisional Patent, Ser. No. 60/349,887, filed Jan. 17, 2002 entitled "Power supply rejection circuit", the teaching of which are incorporated herein by reference.

FIELD OF THE INVENTION

This invention generally relates power amplification circuits. More particularly, it relates to an audio amplifier circuit which reduces power supply noise amplified to the load.

BACKGROUND OF THE INVENTION

When using a Single-ended (Ground Referenced) technique for power amplification, power supply noise is applied to the load through the output stage. In the case of a power supply that is derived from the AC mains this noise will appear at the power line frequency (50/60 Hz) and its harmonics. When a switching power supply is used to power the amplifier, high frequency noise will appear on the load attached to the amplifier. In an automobile the supply is contaminated by many electrical processes.

There are several methods for removing the above-mentioned noise from the output. One method is to use extremely quiet well-regulated power supplies. When doing power amplification this method is frequently too expensive.

A second method is to use the amplifier to reject the power supply noise. Since high power levels are involved, internalizing power supply rejection can significantly increase the cost of the amplifier. Most integrated power supply rejection techniques drop the available power supply voltage in order to regulate. This means less voltage is available to the amplifier output stage, therefore the amplifier will deliver less power to the load and the power dissipation of the amplifier circuit including the regulator will be increased. (It will generate more heat.)

Other prior art circuits used differential outputs to cancel the power supply noise. However, this creates a differential "null point" that increased the cost of the amplifier because additional circuitry was required.

The circuit diagram in FIG. 1 shows a prior art method of using the amplifier to reject the power supply noise. The amplifier contains two MOSFET transistors, M1 and M2. They represent the output circuit for a MOSFET power amplifier output stage. The power supply is shown as a DC source (V1) in series with an ac generator (V2) to simulate a power supply with noise. As can be seen from the circuit diagram, the output of the ac generator in the Existing Circuit, V2 will pass through transistor M1 and the capacitor C1, and appear on the load (RL) as a noise voltage.

SUMMARY OF THE INVENTION

The present invention introduces a novel technique that involves taking the circuit's existing output coupling cap and power supply decoupling cap and connecting them in series from the power supply to ground. The output of the amplifier is then directly coupled to the load and the other side of the load is connected at the "null point" between the two capacitors.

By using this technique, no additional circuitry is required, there is no decrease in available power supply voltage, and the power dissipation of the circuit is not increased.

An advantage of an embodiment of the present invention is a low-cost circuit that will dramatically increase the power supply rejection of the amplifier circuit. Another advantage of and embodiments is it reduces the capacitor count and size in a stereo amplifier while simultaneously eliminating the normal fall in low frequency response. Further advantages of embodiments include not decreasing the available power supply voltage, or increasing the power dissipation of the amplifier including the regulator.

An embodiment of the present invention includes a method of improving the low frequency response of an ac-coupled amplifier without a proportional increase in output coupling capacitance.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION OF THE PREFERRED EMBODIMENTS

Figure 1:
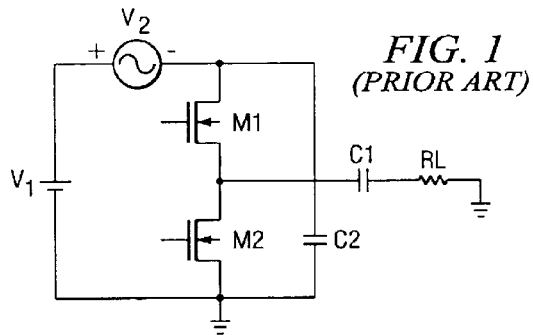
FIG. 1 Shows a prior art amplifier design.
Figure 2:
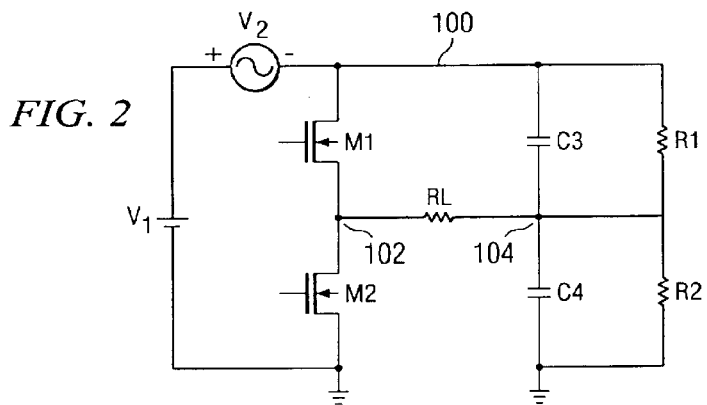
FIG. 2 Shows a circuit according to an embodiment of the present invention.

A preferred embodiment of the present invention is shown in FIG. 2 of the drawings. The circuit diagram represents an amplifier to reject the power supply noise.

In the illustrated embodiment of FIG. 2 the amplifier 100 contains two MOSFET transistors, M1 and M2 connected in series between the power supply voltage and ground. M1 and M2, represent the output circuit for a MOSFET power amplifier output stage. Circuits in the amplifier that drive M1 and M2 are not shown. Typical prior art circuits can be used to drive the output stage. The preferred embodiment is an output stage for an audio power amplifier.

Again referring to FIG. 2, the power supply (V1) is shown as a DC source in series with an ac generator (V2) to simulate a power supply with noise. The first terminal of the load (RL) is connected to the common point 102 of the transistors M1 and M2. The second terminal of the load (RL) is connected to the common point 104 of two capacitors C3 and C4. The capacitors are also connected in series between the power supply voltage and ground. The circuit further includes two resistors R1 and R2 connected in series between the power supply voltage and ground.

The output of the ac generator V2 (power supply/circuit noise) will pass through M1 and appear one side of the load RL; however, V2 will also pass through the capacitors C3 and C4 and appear on the other side of the load. The differential noise and DC voltage will appear at the midpoint of these two capacitors, the point where the load is connected. Therefore, the same noise voltage and the same DC voltage are seen on each side of RL. The only output from the system will be a function of the ac input to the amplifier.

Figure 3:
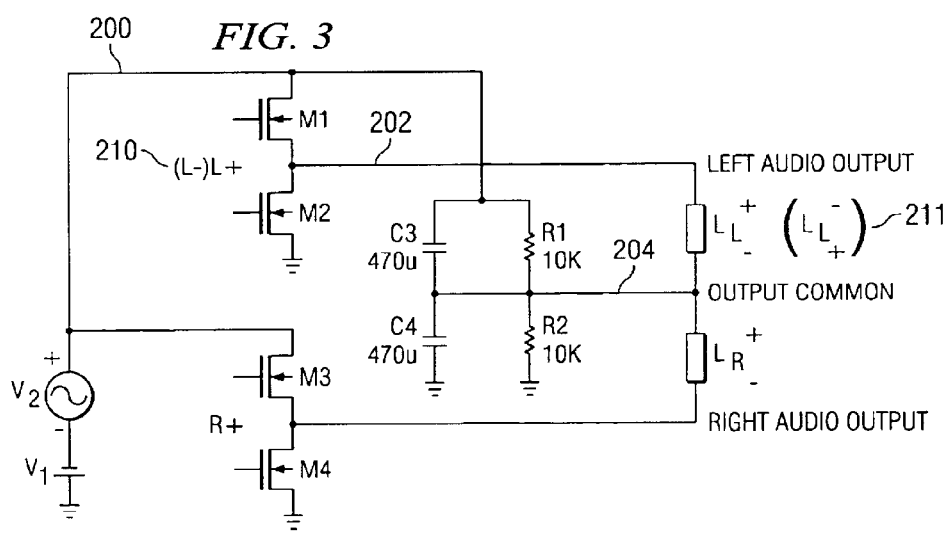
FIG. 3 Shows a circuit according to stereo embodiment of the present invention.

Another embodiment with a stereo output is shown in FIG. 3. In this embodiment, an additional load, driven by an additional pair of MOSFETs, is connected to the same "null point" 204. No extra capacitor is required, thus allowing this stereo amplifier to be implemented with two capacitors instead of the three, which would be normally required (two coupling capacitors plus one decoupling capacitor). In this embodiment, the amplifier 200 contains two pairs of MOSFET transistors, M1, M2 and M3, M4 connected in series between the power supply voltage and ground. M1, M2 and M3 M4 each represent the output circuit for a MOSFET power amplifier output stage. Circuits in the amplifier that drive the MOSFETs are not shown. Typical prior art circuits can be used to drive the output stage.

Again referring to FIG. 3, the power supply (V1) is shown as a DC source in series with an ac generator (V2) to simulate a power supply with noise. The first terminal of the load ($L_L$) is connected to the common point 202 of the transistors M1 and M2. The second terminal of the load ($L_R$) is connected to the common point 104 of two capacitors C3 and C4. The capacitors are also connected in series between the power supply voltage and ground. The circuit further includes two resistors R1 and R2 connected in series between the power supply voltage and ground. The second set of transistors M3 and M4 is similarly connected to a second load ($L_R$). The second terminal of $R_R$ is also connected to the common point 104. In preferred embodiments of the present invention, the loads are audio speakers that have a polarity as shown in FIG. 3.

Just as in the previous embodiment, the output of the ac generator V2 (power supply/circuit noise) will pass through M1 and appear one side of the load $L_L$ and $L_R$ however, V2 will also pass through the capacitors C3 and C4 and appear on the other side of the loads. The differential noise and DC voltage will appear at the midpoint of these two capacitors, the point where the load is connected. Therefore, the same noise voltage and the same DC voltage are seen on each side of the loads.

In the two-channel embodiment shown in FIG. 3, the low frequency response of the pair of channels to a signal applied equally to each channel (which is the norm for a stereo music signal) is extended down to the low frequency response of the parallel combination of the two capacitors, which can therefore be made smaller than would otherwise be permissible for good sound.

In another variation of the two-channel embodiment shown in FIG. 3, it can be shown that with the correct choice of the phase of the applied second channel signal (specifically, that the left channel load be connected to the speaker load with opposite polarity (211) and the left amplifier driven by an inverted signal 210 as shown in FIG. 3), the low frequency response is extended right down to DC, independent of the value of the capacitors, which can therefore be made much smaller.

Since most amplifiers of this type have at least two channels, there is no increase in the number of components over prior art designs except for the two small bias resistors, R1 and R2. Further, since the two capacitors, C3 and C4, appear in parallel, the low frequency ac response of the circuit will be doubled (IE: 25 Hz instead of 50 Hz). Other than the small current in R2 and R3, the circuit does not create any additional load for the power supply and does not affect the thermal performance of the amplifier.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An electronic amplifier circuit comprising:
   a. a power amplifier output stage;
   b. a load with a first connection connected to the output stage; and
   c. two capacitors connected in series between a voltage source and ground and the common point of the two capacitors connected to th second terminal of the load;
   d. wherein the output stage further comprises two transistors connected in series between the voltage source and ground and the common point of the two transistors is connected to the load.

2. The circuit of claim 1, further comprising two resistors connected in series between a voltage source and ground and the common point of the two resistors connected to the second terminal of the load.

3. An audio amplifier electronic circuit comprising:
   a. a first and second power amplifier output stages with inputs, each comprising two transistors connected in series with a common point between the two transistors;
   b. a first load with a first connection connected to the common point of the first power amplifier output stage;
   c. a second load with a first connection connected to the common point of the second power amplifier output stage; and
   d. two capacitors connected in series between a voltage source and ground and the common point of the two capacitors connected to the second terminal of the first and second load.

4. The circuit of claim 3, further comprising two resistors connected in series between a voltage source and ground and the common point of the two resistors connected to the second terminal of the load.

5. The circuit of claim 3 wherein the first power amplifier output stage has an inverted signal input with respect to the second power amplifier output stage input signal and the first load terminals are inverted.

6. The circuit of claim 4 wherein the first power amplifier output stage has an inverted signal input with respect to the second power amplifier output stage input signal.

7. The circuit of claim 3 wherein the transistors are MOSFETs.

8. An amplifier electronic circuit comprising:
   e. a first and second power amplifier output stages with input, each comprising two transistors connected in series with a common point between the two transistors;
   f. a first load with a first connection connected to the common point of the first power amplifier output stage;
   g. a second load with a first connection connected to the common point of the second power amplifier output stage; and
   h. two capacitors connected in series between a voltage source and ground and the common point of the two capacitors connected to the second terminal of the first and second load.

9. The circuit of claim 8, further comprising two resistors connected in series between a voltage source and ground and the common point of the two resistors connected to the second terminal of the load.

10. The circuit of claim 8 wherein the first power amplifier output stage has an inverted signal input with respect to the second power amplifier output stage input signal and the first load terminals are inverted.

11. The circuit of claim 9 wherein the first power amplifier output stage has an inverted signal input with respect to the second power amplifier output stage input signal.

12. The circuit of claim 8 wherein the transistors are MOSFETs.

* * * * *